(12) United States Patent
Kwon et al.

(10) Patent No.: US 8,956,900 B2
(45) Date of Patent: Feb. 17, 2015

(54) LIQUID CRYSTAL DISPLAY DEVICE COMPRISING FIRST AND SECOND DATA LINK LINES ELECTRICALLY CONNECTED TO ODD AND EVEN DATA LINES RESPECTIVELY AND CROSSING EACH OTHER TO CONNECT EVEN AND ODD DATA PAD ELECTRODES RESPECTIVELY

(71) Applicant: LG Display Co., Ltd., Seoul (KR)

(72) Inventors: Jang-Un Kwon, Seoul (KR); Su-Woong Lee, Gumi-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 13/940,885

(22) Filed: Jul. 12, 2013

(65) Prior Publication Data
US 2013/0295702 A1    Nov. 7, 2013

Related U.S. Application Data

(62) Division of application No. 12/247,671, filed on Oct. 8, 2008, now Pat. No. 8,537,320.

(30) Foreign Application Priority Data

Oct. 16, 2007 (KR) ........................ 10-2007-0104092

(51) Int. Cl.
H01L 21/66 (2006.01)
H01L 27/12 (2006.01)
G02F 1/1345 (2006.01)

(52) U.S. Cl.
CPC .......... *H01L 27/1259* (2013.01); *G02F 1/1345* (2013.01)

USPC .......................................................... 438/30

(58) Field of Classification Search
None
See application file for complete search history.

(56) References Cited

U.S. PATENT DOCUMENTS

2004/0036070 A1* 2/2004 Yun ................................. 257/59
2006/0139551 A1* 6/2006 Kimura ......................... 349/149

FOREIGN PATENT DOCUMENTS

KR  10-2007-0003178 A   1/2007
TW  2006/17553          6/2006

OTHER PUBLICATIONS

First Office Action issued in corresponding Taiwanese Patent Application No. 097136678; issued May 24, 2012.

* cited by examiner

*Primary Examiner* — Julio J Maldonado
*Assistant Examiner* — Joseph Galvin, III
(74) *Attorney, Agent, or Firm* — Brinks Gilson & Lione (57) ABSTRACT

A liquid crystal display device includes a gate line on a substrate including a display region and a non-display region; odd and even data lines crossing the gate line to define a pixel region in the display region; a thin film transistor connected to the gate line and one of the odd and even data lines; a pixel electrode in the pixel region and connected to the thin film transistor; first and second data link lines electrically connected to the odd and even data lines, respectively, and formed with a gate insulating layer therebetween; and first and second data pad electrodes at one ends of the first and second data link lines, respectively.

4 Claims, 11 Drawing Sheets

LIQUID CRYSTAL DISPLAY DEVICE COMPRISING FIRST AND SECOND DATA LINK LINES ELECTRICALLY CONNECTED TO ODD AND EVEN DATA LINES RESPECTIVELY AND CROSSING EACH OTHER TO CONNECT EVEN AND ODD DATA PAD ELECTRODES RESPECTIVELY

The present patent document is a divisional of U.S. patent application Ser. No. 12/247,671, filed Oct. 8, 2008, which claims priority to Korean Patent Application No. 10-2007-0104092 filed in Korea on Oct. 16, 2007, all of which are hereby incorporated by reference.

BACKGROUND OF THE INVENTION

1. Field of the Invention

The present invention relates to a liquid crystal display device, and more particularly, to a liquid crystal display (LCD) device and a method of manufacturing the same.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panels (PDPs), field emission displays, and electro-luminescence displays (ELDs), as a substitute for CRTs. Of these flat panel displays, LCD devices have many advantages, such as high resolution, light weight, thin profile, compact size, and low voltage power supply requirements.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field into the direction of the induced electric field, thereby changing the light transmissivity of the LCD device. Thus, the LCD device displays images by varying the intensity of the induced electric field.

Figure 1:
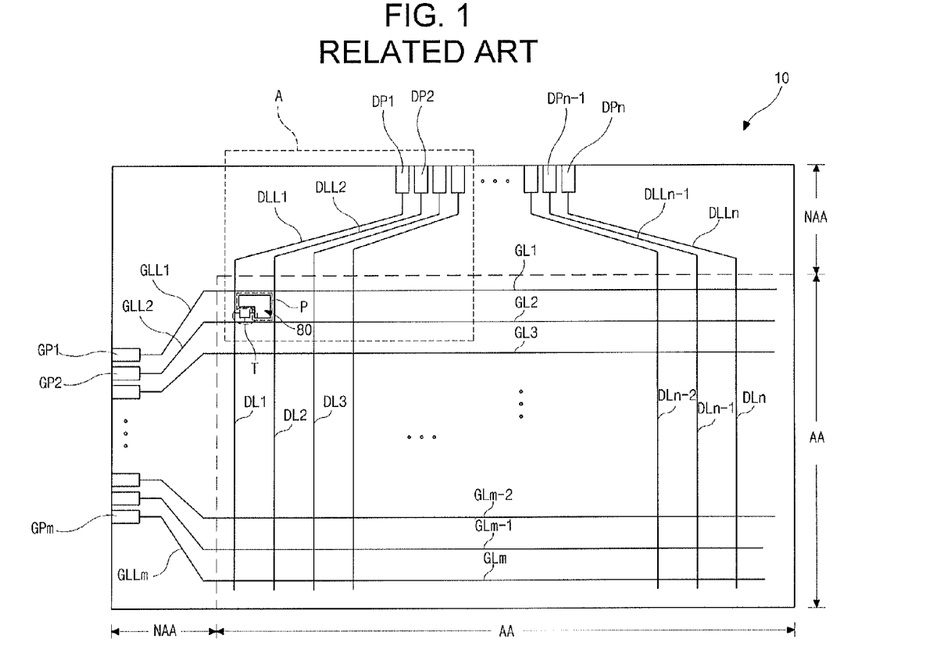
FIG. 1 is a schematic view illustrating an array substrate of an LCD device according to the related art.

FIG. 1 is a schematic view illustrating an array substrate of an LCD device according to the related art.

Referring to FIG. 1, the array substrate includes a display region AA to display images and a non-display region NAA. The array substrate 10 includes first to $m^{th}$ gate lines GL1 to GLm and first to $n^{th}$ data lines DL1 to DLn crossing each other on a substrate 10 to define a plurality of pixel regions P in the display region AA. A thin film transistor T is in each pixel region P and connected to the corresponding gate and data lines, and a pixel electrode 80 is in each pixel region P and connected to the thin film transistor T.

In the non-display region NAA, the array substrate includes first to $m^{th}$ gate link lines GLL1 to GLLm and first to $n^{th}$ data link lines DLL1 to DLLn, first to $m^{th}$ gate pads GP1 to GPm connected to the first to $m^{th}$ gate link lines GLL1 to GLLm, respectively, first to $n^{th}$ data pads DP1 to DPn connected to the first to $n^{th}$ data link lines DLL1 to DLLn, respectively. The first to $m^{th}$ gate lines GL1 to GLm are connected to the first to $m^{th}$ gate link lines GLL1 to GLLm, respectively, and the first to $n^{th}$ data lines DL1 to DLn are connected to the first to $n^{th}$ data link lines DLL1 to DLLn, respectively.

The gate pads GP1 to GPm and the data pads DP1 to DPn are attached to gate and data driving portions, for example, through a TAB (tape automated bonding) process. Accordingly, gate and data signals are supplied from the driving portions to the gate and data lines GL1 to GLm to DL1 to DLn.

In the related art, the gate lines, the gate link lines and the gate pads are formed at the same layer, and the data lines, the data link lines and the data pads are formed at the same layer. Accordingly, there is a limit to reducing an area of the non-display region. This problem is explained as follows.

Figure 2:
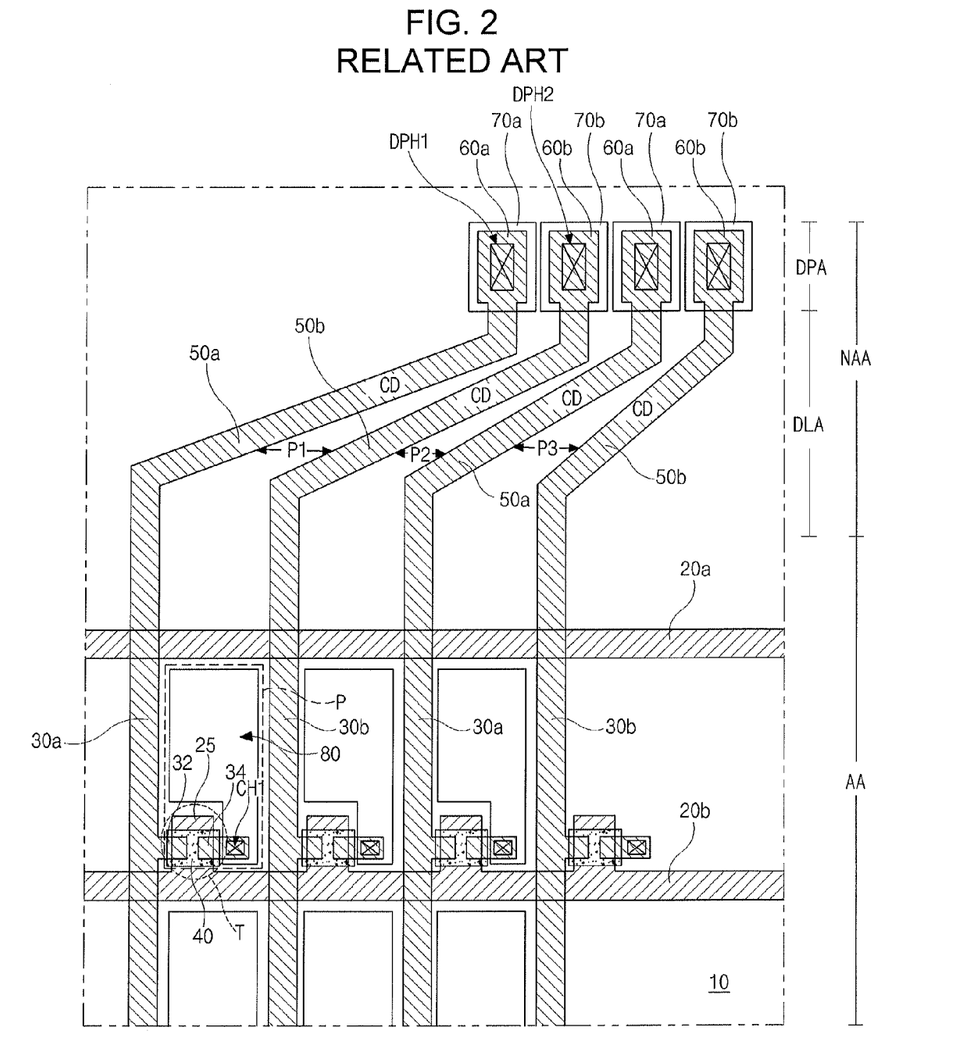
FIG. 2 is a view enlarging a portion A of FIG. 1.

FIG. 2 is a view enlarging a portion A of FIG. 1.

Referring to FIG. 2, in a display region AA, gate lines include odd and even gate lines 20a and 20b alternately arranged on a substrate 10, and data lines include odd and even data lines 30a and 30b alternately arranged.

A thin film transistor T includes a gate electrode 25, a semiconductor layer 40 on the gate electrode 25, and source and drain electrodes 32 and 34 on the semiconductor layer 40. The semiconductor layer 40 includes an active layer made of intrinsic amorphous silicon and an ohmic contact layer made of extrinsic amorphous silicon. A pixel electrode 80 in a pixel region P is connected to the drain electrode 34.

A non-display region NAA includes a data link region DLA, and a data pad region DPA. In the data link region DLA, data link lines include odd and even data link lines 50a and 50b alternately arranged. In the data pad region DPA, data pads include odd and even data pads. The odd data pad include an odd data pad electrode 60a and an odd data pad terminal electrode 70 connected to the odd data pad electrode 60a through an odd data pad contact hole DPH1. The even data pad include an even data pad electrode 60b and an even data pad terminal electrode 70b connected to an even data pad contact hole DPH2.

The odd and even data lines 30a and 30b, the odd and even data link lines 50a and 50b, and the odd and even data pad electrodes 60a and 60b are formed at the same layer.

To reduce an area of the non-display region NAA, it is suggested to reduce areas of the data pads. This, however, causes increase of resistance of the data pad and delay of the data signal, and thus, display degradation, for example, after-image occurs.

Alternatively, when a width CD of the data link line is reduced, this causes increase of resistance of the data link line and delay of the data signal. Accordingly, reduction of the width of the data link line has a limit.

Alternatively, it has been suggested to reduce an area of the data link region DLA and form the data pad region DPA closer to the display region AA. This involves reducing distances P1, P2 and P3 between the data link lines. As the distances are reduced, the data link lines may be subject to a short-circuit due to conductive particles, which are in a process chamber, stuck to the data link lines.

These problems make it difficult to reduce the area of the non-display region.

SUMMARY OF THE INVENTION

A liquid crystal display device includes a gate line on a substrate including a display region and a non-display region; odd and even data lines crossing the gate line to define a pixel region in the display region; a thin film transistor connected to the gate line and one of the odd and even data lines; a pixel electrode in the pixel region and connected to the thin film transistor; first and second data link lines electrically connected to the odd and even data lines, respectively, and formed with a gate insulating layer therebetween; and first and second data pad electrodes at one ends of the first and second data link lines, respectively.

In another aspect, a method of manufacturing a liquid crystal display device includes forming a gate line, a first data link line and a first data pad electrode at an end of the first data link line on a substrate; forming a gate insulating layer on the gate line, the first data link line and the first data pad electrode; forming odd and even data lines, a second data link line and a second data pad electrode at an end of the second data link line, wherein one of the first and second data link lines is electrically connected to the odd data line, and the other of the first and second data link lines is electrically connected to the even data line; forming a thin film transistor connected to the gate line and one of the odd and even data lines; forming a passivation layer on the odd and even data lines, the second data link line, the second data pad electrode; and forming a pixel electrode on the passivation layer and connected to the thin film transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to illustrated embodiments of the present invention, which are illustrated in the accompanying drawings.

Figure 3:
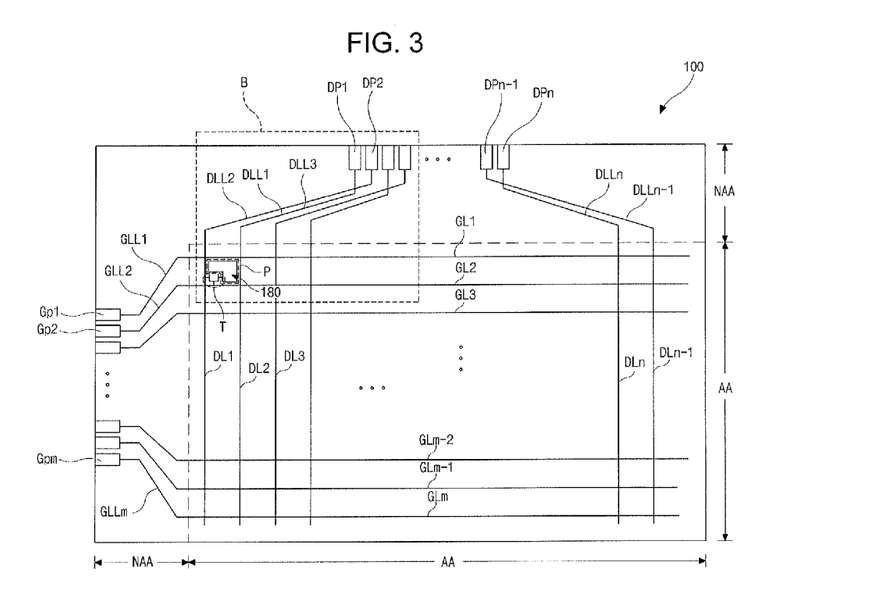
FIG. 3 is a plan view illustrating an array substrate of an LCD device according to a first embodiment of the present invention.

FIG. 3 is a plan view illustrating an array substrate of an LCD device according to a first embodiment of the present invention.

Referring to FIG. 3, the array substrate includes a display region AA to display images and a non-display region NAA.

In the display region AA, the array substrate includes first to $m^{th}$ gate lines GL1 to GLm each extended in a first direction and first to $n^{th}$ data lines DL1 to DLn each extended in a second direction and crossing the first to $m^{th}$ gate lines GL1 to GLm to define a plurality of pixel regions P in a matrix form.

A thin film transistor T is located in each pixel region P and connected to the corresponding gate and data lines. A pixel electrode 180 is located in each pixel region P and connected to the thin film transistor T. The pixel electrode 180 may be formed of a transparent conductive material including indium-tin-oxide (ITO), indium-zinc-oxide (IZO) and indium-tin-zinc-oxide (ITZO). When the LCD device is an in-plane switching mode LCD device, a pixel electrode and a common electrode to induce an in-plane electric field may be located in common in the array substrate, and first to $m^{th}$ common lines may be formed in parallel to the first to $m^{th}$ gate lines, respectively.

In the non-display region NAA, first to $m^{th}$ gate link lines GLL1 to GLLm, first to $m^{th}$ gate pads GP1 to GPm, first to $n^{th}$ data link lines DLL1 to DLLn, and first to $n^{th}$ data pads DP1 to DPn are formed. The gate link lines are connected to the corresponding gate lines at one ends of the gate link lines and connected to the corresponding gate pads at the other ends of the gate link lines. The data link lines are connected to the corresponding data lines at one ends of the data link lines and connected to the corresponding data pads at the other ends of the data link lines. The gate pad may include a gate pad electrode and a gate pad terminal electrode on and connected to the gate pad electrode, and the data pad may include a data pad electrode and a data pad terminal electrode on and connected to the data pad electrode.

The first to $n^{th}$ data lines DL1 to DLn, the first to $n^{th}$ data pads DP1 to DPn, and the first to $n^{th}$ data link lines DLL1 to DLLn may be numbered in the first direction, for example, left to right, and the first to nth data pads DP1 to DPn may be numbered in the numbering direction of the data lines. The data link lines may be connected to the same-numbered data pads. The odd data link line may be paired with and cross the next-numbered even data link line, and the odd data link line may be connected to the next-numbered even data line and the next-numbered even data link line may be connected to the odd data line numbered in same as the odd data link line. For example, the first data link line DLL1 connected to the first data pad DP1 crosses the second data link line DLL2 connected to the second data pad DP2, the first data link line DLL1 is connected to the second data line DL2, and the second data link line DLL2 is connected to the first data line DL1.

Figure 4:
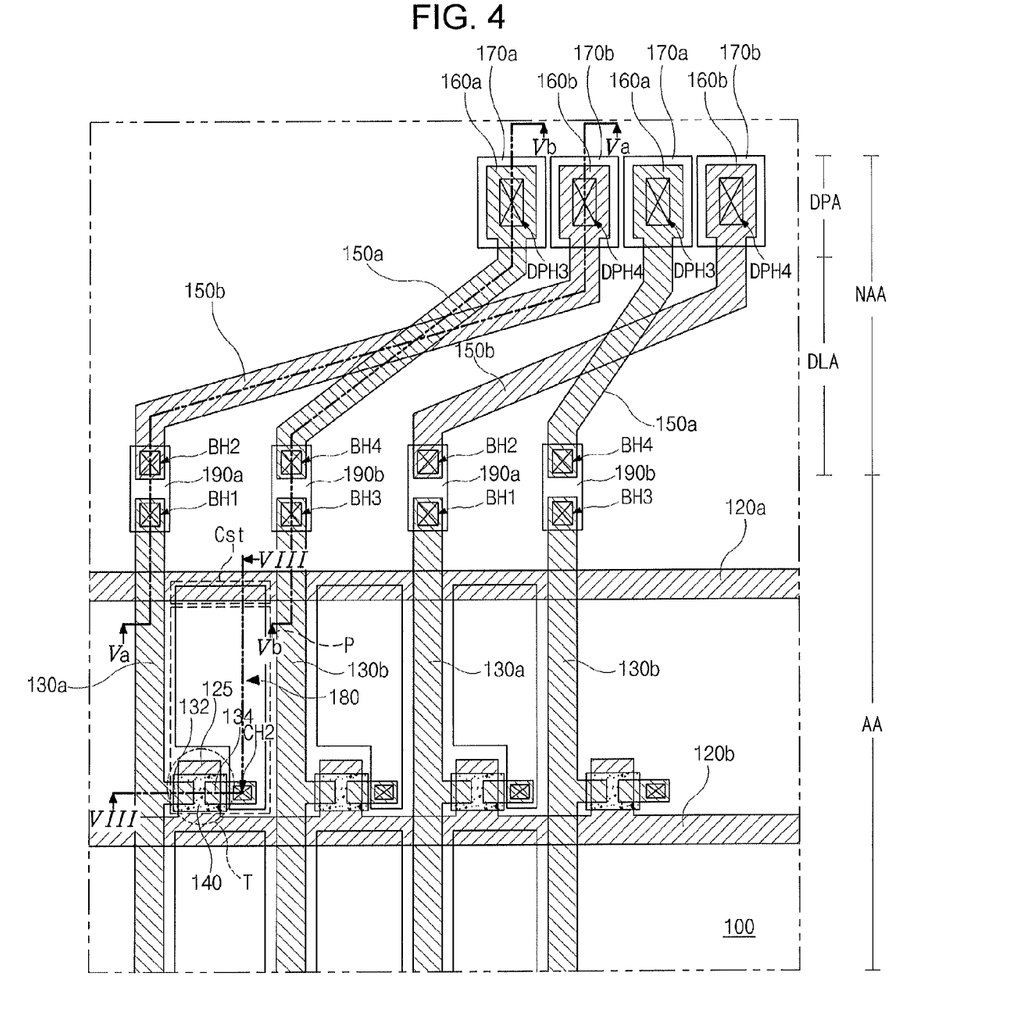
FIG. 4 is a plan view enlarging a portion B of FIG. 3.
Figure 5A:
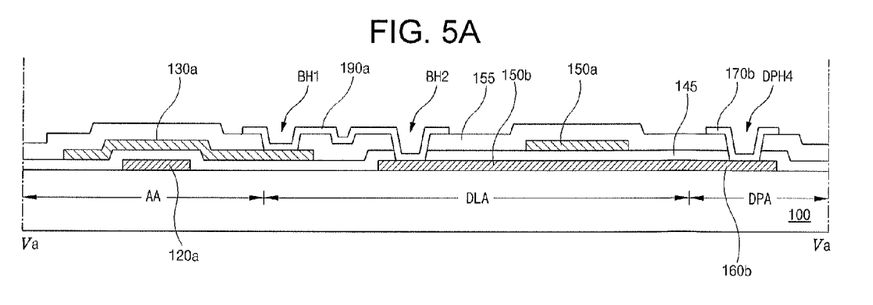
FIGS. 5A and 5B are cross-sectional views taken along lines Va-Va and Vb-Vb, respectively.
Figure 5B:
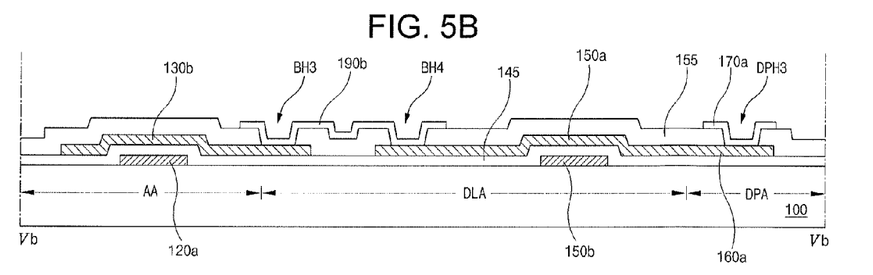

FIG. 4 is a plan view enlarging a portion B of FIG. 3, and FIGS. 5A and 5B are cross-sectional views taken along lines Va-Va and Vb-Vb, respectively.

Referring to FIG. 4, in a display region AA, gate lines extended in a first direction include odd and even gate lines 120a and 120b alternately arranged in a second direction on a substrate 100, and data lines extended in the second direction include odd and even data lines 130a and 130b alternately arranged in the first direction.

A thin film transistor T includes a gate electrode 125, a semiconductor layer 140 on the gate electrode 125, and source and drain electrodes 132 and 134 on the semiconductor layer 140. The semiconductor layer 140 includes an active layer made of intrinsic amorphous silicon and an ohmic contact layer made of extrinsic amorphous silicon. A pixel electrode 180 in a pixel region P is connected to the drain electrode 134. The pixel electrode 180 may be formed of a transparent conductive material including indium-tin-oxide (ITO), indium-zinc-oxide (IZO) and indium-tin-zinc-oxide (ITZO). The pixel electrode 180 may overlap the gate line 120a and 120b with a gate insulating layer therebetween to form a storage capacitor Cst. A portion of the pixel electrode 180 overlapping the gate line 120a and 120b may be a first storage electrode, and a portion of the gate line 120a or 120b may be a second storage electrode.

A non-display region NAA includes a data link region DLA, and a data pad region DPA. In the data link region DLA, data link lines include odd and even data link lines 150a and 150b alternately arranged. In the data pad region DPA, data pads include odd and even data pads alternately arranged. The odd data pad include an odd data pad electrode 160a and an odd data pad terminal electrode 170a connected to the odd data pad electrode 160a through an odd data pad contact hole DPH3. The even data pad include an even data pad electrode 160b and an even data pad terminal electrode 170b connected to an even data pad contact hole DPH4.

The data pad electrodes 160a and 160b are connected to one ends of the data link lines 150a and 150b. The odd data link line 150a and the odd data pad electrode 160a may be formed at the same process and be in a single body, and the even data link line 150b and the even data pad electrode 160b may be formed at the same process and be in a single body. The odd data link line 150a and the odd data pad electrode 160a may be formed at the process and at the layer different from the even data link line 150b and the even data pad electrode 160b.

The other ends of the data link lines 150a and 150b are connected to the data lines 130a and 130b through bridge patterns. The bridge patterns include odd and even bridge patterns 190a and 190b. The odd bridge pattern 190a connects the odd data line 130a and the even data link line 150b, and the even bridge pattern 190b connects the even data line 130b and the odd data link line 150a.

The one of the odd and even data link lines 150a and 150b may be formed at the same process as the data lines 130a and 130b, and the other of the odd and even data link lines 150a and 150b may be formed at the same process as the gate lines 120a and 120b. For example, the odd data link lines 150a are formed at the data lines 130a and 130b, and the even data link lines 150b are formed at the gate lines 120a and 120b. Accordingly, the odd data link line 150a can be formed at the different layer from and cross the even data link line 150b.

Referring to FIGS. 4, 5A and 5B, the gate line 120a and 120b, the even data link line 150b and the even data pad electrode 160b are formed on the substrate 100. A gate insulating layer 145 is formed on the gate line 120a and 120b, the even data link line 150b and the even data pad electrode 160b. The gate insulating layer 145 may be formed of an inorganic insulating material including silicon oxide (SiO$_2$) and silicon nitride (SiNx). The data line 130a and 130b, the odd data link line 150a and the odd data pad electrode 160a are formed on the gate insulating layer 145.

A passivation layer 155 is formed on the data line 130a and 130b, the odd data link line 150a and the odd data pad electrode 160a. The passivation layer 155 may be formed of an organic insulating material including benzocyclobutene (BCB) and photo acrylic, or an inorganic insulating material including (SiO$_2$) and silicon nitride (SiNx). The pixel electrode 180, the bridge pattern 190a and 190b and the data pad terminal electrode 170a and 170b are formed on the passivation layer 155.

One end of the odd bridge pattern 190a is connected to the odd data line 130a through a first contact hole BH1, and the other end of the odd bridge 190 is connected to the even data link line 150b through a second contact hole BH2. One end of the even bridge pattern 190b is connected to the even data line 130b through a third contact hole BH3, and the other end of the even bridge pattern 190b is connected to the odd data link line 150a through a fourth contact hole BH4. The first contact hole BH1, the second contact hole BH2 and the fourth contact hole BH4 are formed in the passivation layer 155. The second contact hole BH2 is formed in the passivation layer 155 and the gate insulating layer 145.

The odd data pad terminal electrode 170a is connected to the odd data pad electrode 160a through the first data pad contact hole DPH3, and the even data pad terminal electrode 170b is connected to the even data pad electrode 160b through the second data pad contact hole DPH4. The first data pad contact hole DPH3 is formed in the passivation layer 155, and the second data pad contact hole DPH4 is formed in the passivation layer 155 and the gate insulating layer 145.

Since the odd data link line 150a and the even data link line 150b are formed with the gate insulating layer 145 therebetween, short-circuit between the even and odd data link lines 150a and 150b can be prevented. Accordingly, the distance between the even and odd data link lines 150a and 150b does not need to be considered and can be minimized, and the data link region DLA and the non-display region NAA can thus be minimized. Further, when the odd and even data link lines 150a and 150b cross each other, the data link region DLA and the non-display region NAA can be further minimized.

The odd data link line 150a and the odd data pad electrode 160a are formed at the same layer and the same material as the data line 130a and 130b while the even data link line 150b and the even data pad electrode 160b are formed at the different layer from the data line 130a and 130b, and there may be a difference between a resistance of the odd data link line 150a, the odd data pad electrode 160a and the even data line 130b and a resistance of the even data link line 150b, the even data pad electrode 160b and the odd data line 130a. To minimize the resistance difference, the even bridge pattern 190b connecting the even data line 130b and the odd data link line and data pad electrode 150a and 160a is used. Since the resistance difference between the lines transmitting data signals is minimized using the bridge patterns 190a and 190b, display quality can be improved.

To further reduce the distance between the odd and even data link lines 150a and 150b, there might be suggested a method that the odd and even data link lines 150a and 150b are formed in the same line in plane to maximize the overlapping area of the odd and even data link lines 150a and 150b. However, this method would increase a parasitic capacitance of the odd and even data link lines 150a and 150b. Accordingly, to minimize the parasitic capacitance of the odd and even data link lines 150a and 150b, the overlapping area of the odd and even data link lines 150a and 150b may be minimized.

FIGS. 6A to 6D are cross-sectional views, taken along the line Va-Va of FIG. 4, illustrating processes of manufacturing the array substrate of the LCD device the according to the first embodiment of the present invention, FIGS. 7A to 7D are cross-sectional views, taken along the line Vb-Vb of FIG. 4, illustrating processes of manufacturing the array substrate of the LCD device the according to the first embodiment of the present invention, and FIGS. 8A to 8D are cross-sectional views, taken along a line VIII-VIII of FIG. 4, illustrating processes of manufacturing the array substrate of the LCD device the according to the first embodiment of the present invention.

Figure 6A:
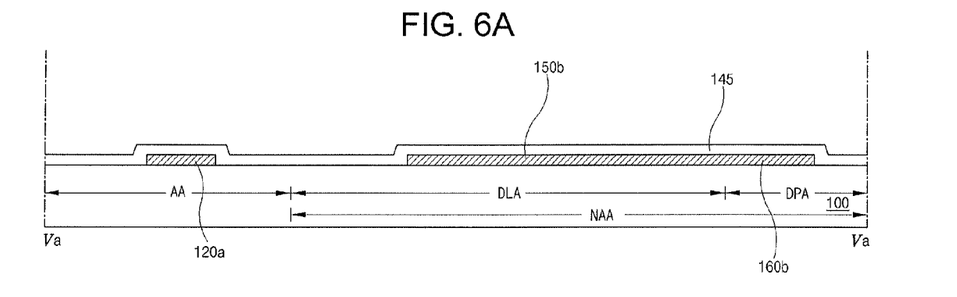
FIGS. 6A to 6D are cross-sectional views, taken along the line Va-Va of FIG. 4, illustrating processes of manufacturing the array substrate of the LCD device the according to the first embodiment of the present invention.
Figure 7A:
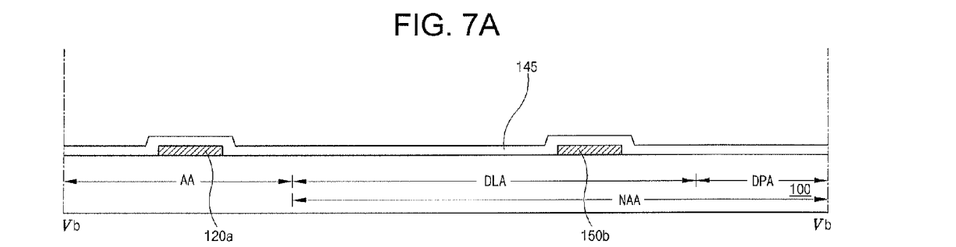
FIGS. 7A to 7D are cross-sectional views, taken along the line Vb-Vb of FIG. 4, illustrating processes of manufacturing the array substrate of the LCD device the according to the first embodiment of the present invention.
Figure 8A:
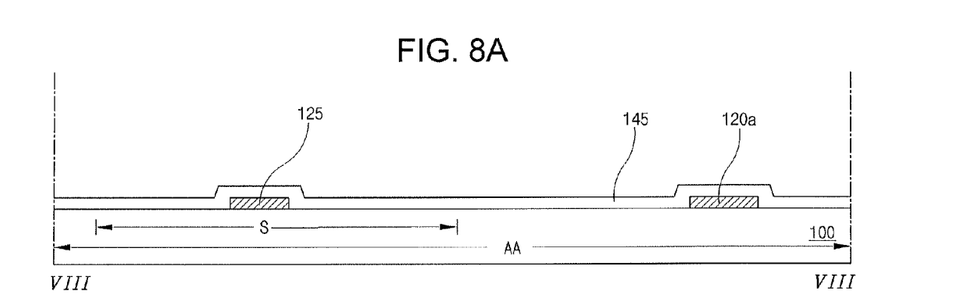
FIGS. 8A to 8D are cross-sectional views, taken along a line VIII-VIII of FIG. 4, illustrating processes of manufacturing the array substrate of the LCD device the according to the first embodiment of the present invention.

Referring to FIGS. 6A, 7A and 8A, a first metal layer is formed on a substrate 100 and patterned to form a gate line 120a (and 120b of FIG. 4), a gate electrode 125 in a switching region Sofa display region AA, an even data link line 150b in a data link region (DLA) of a non-display region (NAA) and an even data pad electrode 160b in a data pad region (DPA). The first metal layer may be formed of at least one of copper (Cu), molybdenum (Mo), molybdenum alloy (MoTi), aluminum alloy (AlNd) and chromium (Cr). A gate insulating layer 145 is formed on the substrate 100 having the gate electrode 125.

Figure 6B:
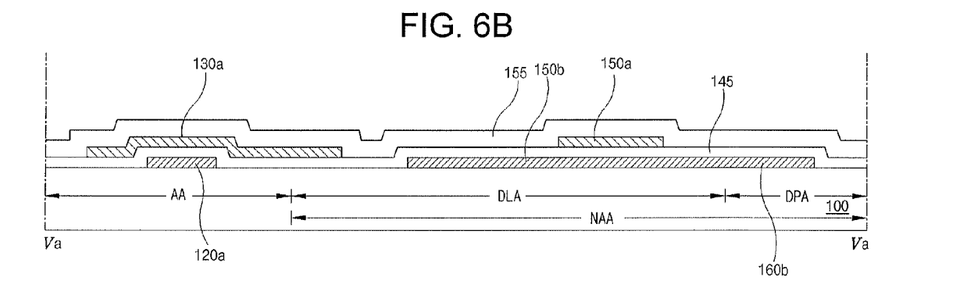
Figure 7B:
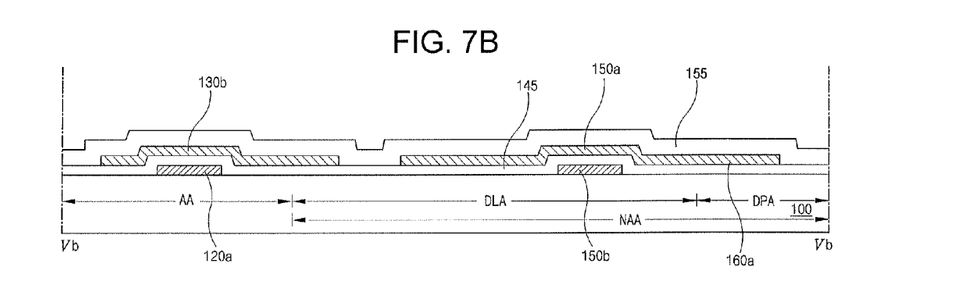
Figure 8B:
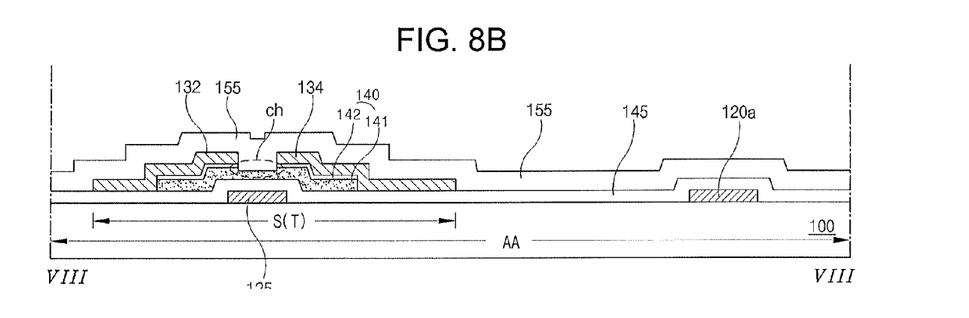

Referring to FIGS. 6B, 7B and 8B, an intrinsic amorphous silicon layer and an extrinsic amorphous silicon layer are sequentially formed on the gate insulating layer 145 and patterned to form a semiconductor layer 140. The semiconductor layer 140 includes an active layer 141 of intrinsic amorphous silicon and an ohmic contact layer 142 of extrinsic amorphous silicon.

A second metal layer is formed on the substrate 100 having the semiconductor layer 140 and patterned to form source and drain electrodes 132 and 134, a data line 130a and 130b, an odd data link line 150a and an odd data pad electrode 160a. The second metal layer may be formed of at least one of copper (Cu), molybdenum (Mo), molybdenum alloy (MoTi), aluminum alloy (AlNd) and chromium (Cr). The ohmic contact layer 142 may be etched using the source and drain electrodes 132 and 134 spaced apart from each other, and a center portion of the ohmic contact layer 142 may be removed. Further, a portion of the active layer 141 below the removed portion of the ohmic contact layer 142 may be partially etched, and the exposed portion of the active layer 141 through the removed portion of the ohmic contact layer 142 functions as a channel CH. The gate electrode 125, the semiconductor layer 140 and the source and drain electrodes 132 and 134 form a thin film transistor T. The odd link line 150a crosses the even link line 150b with the gate insulating layer therebetween, and short-circuit can be prevented.

Figure 6C:
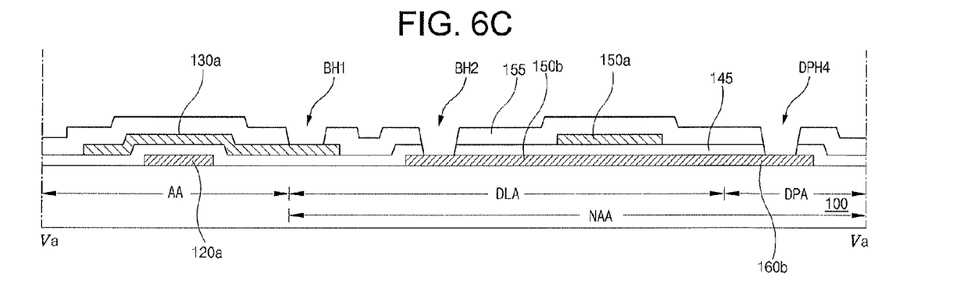
Figure 7C:
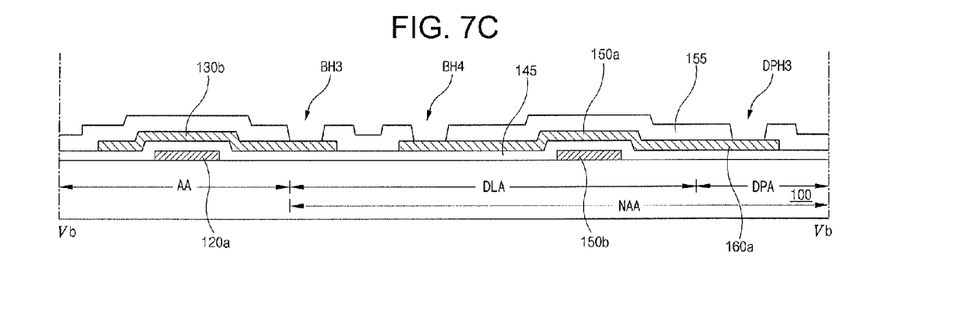
Figure 8C:
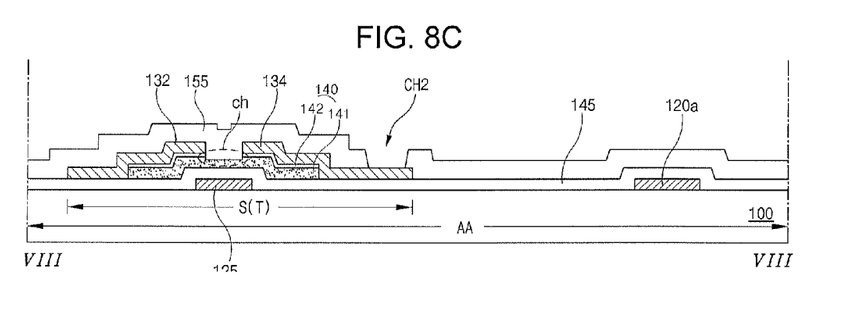

A passivation layer 155 is formed on the substrate 100 having the source and drain electrodes 132 and 134. The passivation layer 155 is etched, for example, dry-etched, to form a drain contact hole CH2 exposing the drain electrode 134, a first contact hole BH1 exposing an end of the odd data line 130a, a third contact hole BH3 exposing an end of the even data line 130b, a fourth contact hole BH4 exposing an end of the odd data link line 150a, and a first data pad contact hole DPH3 exposing the odd data pad electrode 160a. Further, the passivation layer 155 and the gate insulating layer 145 are etched, for example, dry-etched, to form a second contact hole BH2 exposing an end of the even data link line 150b, and a second data pad contact hole DPH4 exposing the even data pad electrode 160b.

Figure 6D:
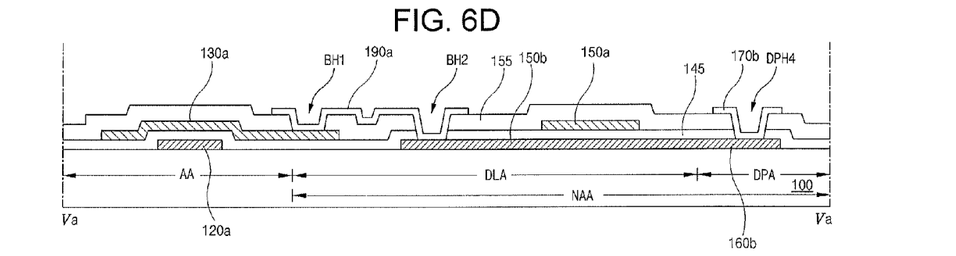
Figure 7D:
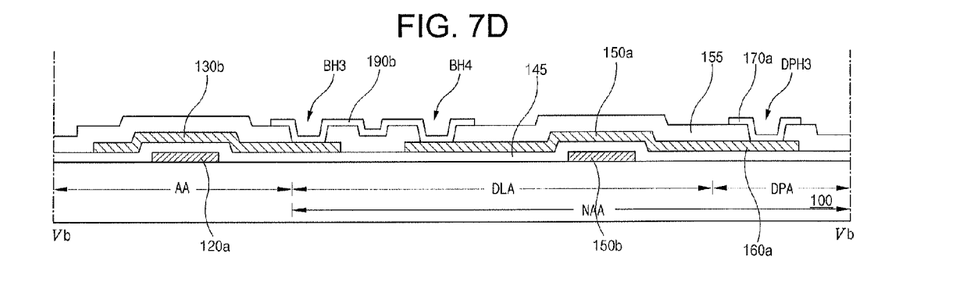
Figure 8D:
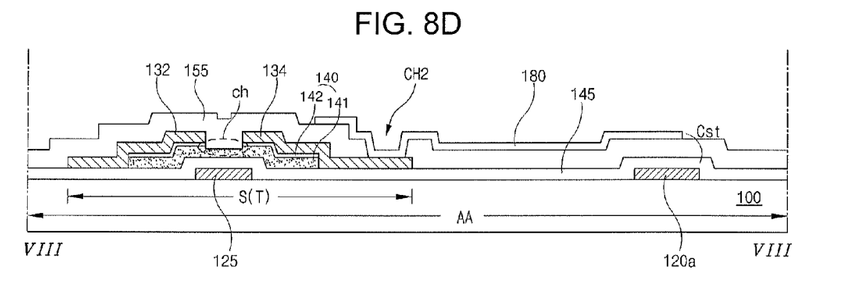

Referring to FIGS. 6D, 7D and 8D, a transparent conductive material is deposited on the passivation layer 155 and patterned to form a pixel electrode 180, odd and even data pad terminal electrodes 170a and 170b, and odd and even bridge patterns 190a and 190b. The pixel electrode 180 is connected to the drain electrode 134 through the drain contact hole CH2. The odd data pad terminal electrode 170a is connected to the odd data pad electrode 160a through the first data pad contact hole DPH3, and the even data pad terminal electrode 170b is connected to the even data pad electrode 160b through the second data pad contact hole DPH4. The odd bridge pattern 190a is connected to the odd data line 130a through the first contact hole BH1 and the even data link line 150b through the second contact hole BH2, and the even bridge pattern 190b is connected to the even data line 130b through the third contact hole BH3 and the odd data link line 150a through the fourth contact hole BH4.

The pixel electrode 180 may extend over the gate line 120a (and 120b of FIG. 4) with the gate insulating layer 145 therebetween to form a storage capacitor Cst.

Through the above-described processes, the array substrate according to the first embodiment is manufactured. Further, an opposing substrate is attached to the array substrate so that the LCD device is manufactured.

In manufacturing the array substrate according to the first embodiment, the first to fourth contact holes are formed at the same process of forming the drain contact hole and the gate pad contact holes, and the bridge patterns are formed at the same process of forming the pixel electrode and the data pad terminal electrodes. Accordingly, the first to fourth contact holes and the bridge patterns can be formed without additional process.

In the method of manufacturing the array substrate according to the first embodiment, it is explained that the array substrate is manufactured with five mask processes. Alternatively, the array substrate can be manufactured with four or less mask processes.

Figure 9:
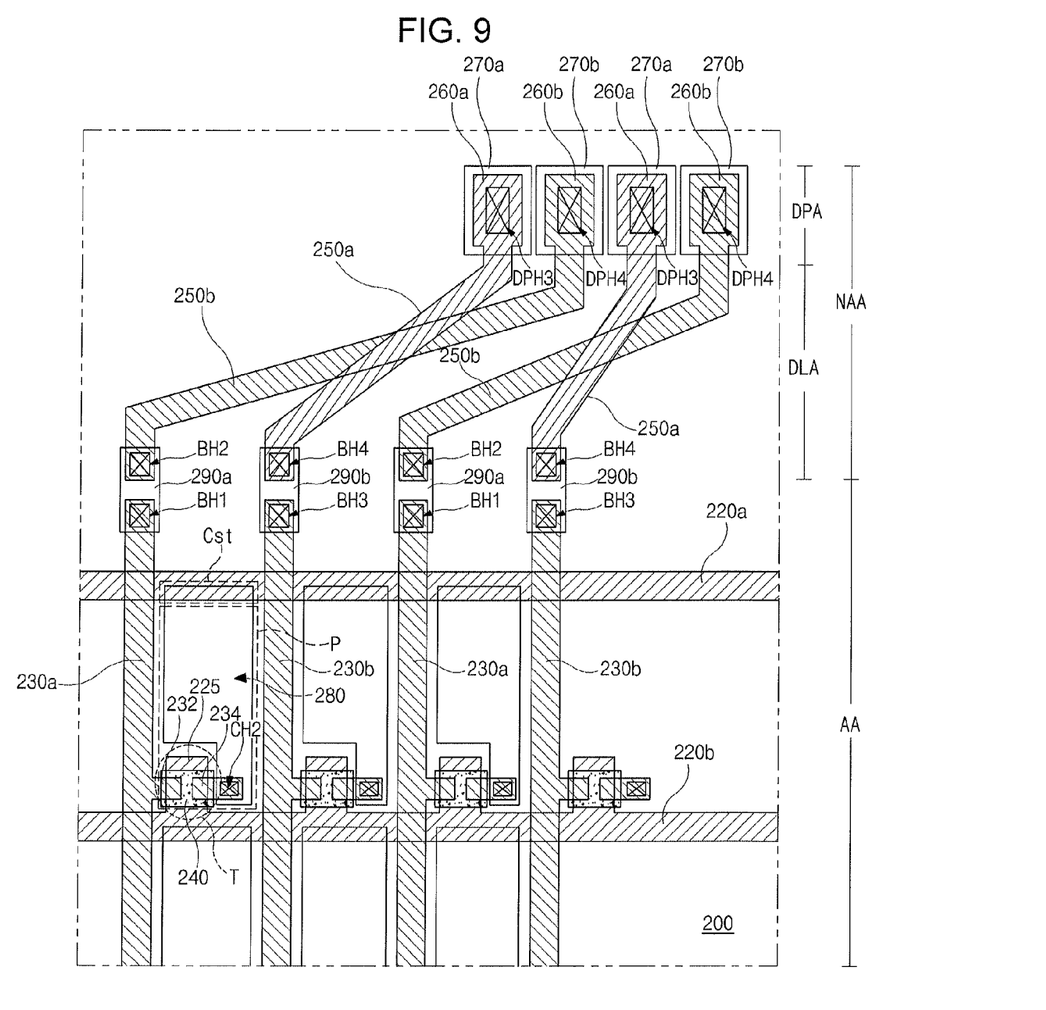
FIG. 9 is a plan view illustrating an array substrate of an LCD device according to a second embodiment of the present invention.

FIG. 9 is a plan view illustrating an array substrate of an LCD device according to a second embodiment of the present invention. The array substrate according to the second embodiment is similar to the array substrate according to the first embodiment. Accordingly, explanations of parts similar to parts of the first embodiment may be omitted.

Odd and even data link lines 250a and 250b of FIG. 9 change positions compared to the odd and even data link lines 150a and 150b of FIG. 4. In other words, the odd data link line 250a is formed at the same layer as a gate line 220a and 220b, and the even data link line 250b is formed at the same layer as a data line 230a and 230b. Further, an odd data pad electrode 260a is formed at the same layer as the gate line 220a and 220b, and an even data pad electrode 260b is formed at the same layer as the data line 230a and 230b.

Further, a second contact hole BH2 and a second data pad contact hole DPH4 are formed in a passivation layer since the even data link line 250b and the even data pad electrode 260b are formed at the same layer as the data line 230a and 230b. A fourth contact hole BH4 and a first data pad contact hole DPH3 are formed in the passivation layer and a gate insulating layer since the odd data link line 250a and the odd data pad electrode 260a are formed at the same layer as the gate line 220a and 220b.

In the second embodiment, even though the odd and even data link lines change positions in layer compared to those of the first embodiment, the odd and even data link lines cross each other with the gate insulating layer therebetween.

A method of manufacturing the array substrate according to the second embodiment is similar to the method of manufacturing the array substrate according to the first embodiment and has a little variation as described above, for example, in forming the odd and even data link lines, the odd and even data pad electrodes, the first to fourth contact holes and the gate pad contact holes. Accordingly, explanations of the method of manufacturing the array substrate according to the second embodiment are omitted.

Figure 10:
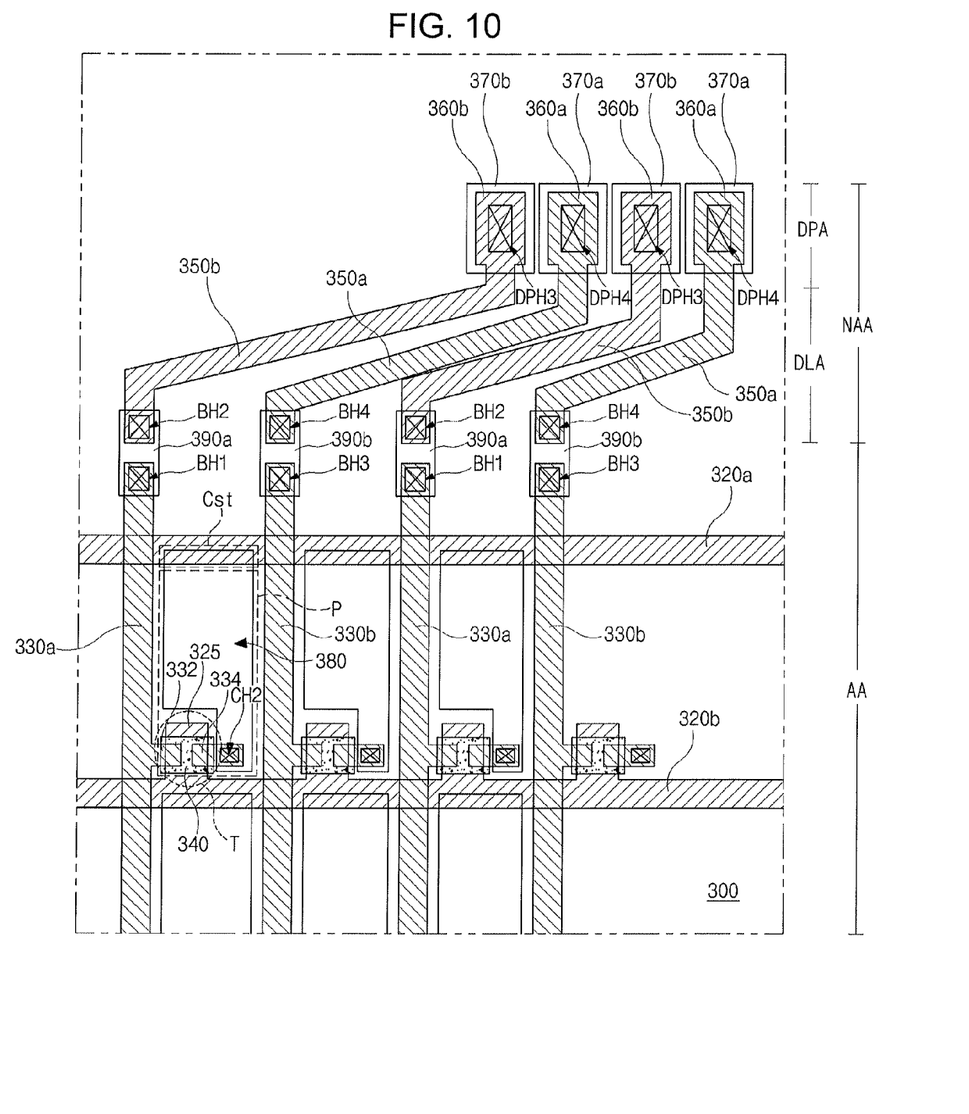
FIG. 10 is a plan view illustrating an array substrate of an LCD device according to a third embodiment of the present invention.

FIG. 10 is a plan view illustrating an array substrate of an LCD device according to a third embodiment of the present invention. The array substrate according to the third embodiment is similar to the array substrates according to the first and second embodiments. Accordingly, explanations of parts similar to parts of the first and second embodiments may be omitted.

Odd and even data link lines 350a and 350b of FIG. 10 are formed at different layers and do not cross each other. For example, the odd data link line 350a is formed at the same layer as a gate line 320a and 320b, and the even data link line 350b is formed at the same layer as a data line 330a and 330b. The odd data link line 350a is close to the even data link line 350b to the extent that the odd and even data link lines 350a and 350b do not overlap and a parasitic capacitance of the odd and even data link lines 350a and 350b is minimized. Accordingly, the odd data link line 350a is connected to the odd data line 330a through an odd bridge pattern 390a, and the even data link line 350b is connected to the even data line 330b through an even bridge pattern 390b.

Further, the odd data pad electrode 360a is formed at the same layer as the gate line 320a and 320b, and the even data pad electrode 360b is formed at the same layer as the data line 330a and 330b. The odd data pad electrode 360a is close to the even data pad electrode 360b as the odd data link line 350a is close to the even data link line 350b.

First, third and fourth contact holes BH1, BH3 and BH4 and a second data pad contact hole DPH4 are formed in a passivation layer, and a second contact hole BH2 and a first data pad contact hole DPH3 are formed in the passivation layer and a gate insulating layer.

A method of manufacturing the array substrate according to the third embodiment is similar to the method of manufacturing the array substrates according to the first and second embodiments and has a little variation as described above, for example, in forming the odd and even data link lines, the odd and even data pad electrodes, the first to fourth contact holes and the gate pad contact holes. Accordingly, explanations of the method of manufacturing the array substrate according to the third embodiment are omitted.

In the array substrate according to the third embodiment, it is explained that the odd data link line 350a and the odd data pad electrode 360a are formed at the same layer as the gate line 320a and 320b, and the even data link line 350b and the even data pad electrode 360b are formed at the same layer as the data line 330a and 330b. Alternatively, the odd data link line 350a and the odd data pad electrode 360a may be formed at the same layer as the data line 330a and 330b, and the even data link line 350b and the even data pad electrode 360b are formed at the same layer as the gate line 320a and 320b.

As described in the embodiments of the present invention, since the odd and even data link lines are formed at different layers with the gate insulating layer therebetween, short-circuit between the even and odd data link lines can be prevented, and the data link region and the non-display region can be minimized. Further, since the bridge patterns are used, the resistance difference between the metal lines transmitting data signals can be minimized, and display quality can thus be improved.

In the embodiments of the present invention, the data link lines and the data pad electrodes formed at different layers are explained. In similar manners to the first to third embodiments, the gate link lines and the gate pad electrodes can be formed. For example, the odd and even gate link lines are formed at the different layers with the gate insulating layer. Further, the odd and even gate link lines cross each other. Further, the odd and even gate pad electrodes are formed at the different layers with the gate insulating layer. Further, bridge patterns and contact holes and gate pad contact holes are formed according to the lamination structure of the gate link lines and the gate pad electrodes.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a liquid crystal display device, comprising:
   forming a gate line, a first data link line and a first data pad electrode at an end of the first data link line on a substrate;
   forming a gate insulating layer on the gate line, the first data link line and the first data pad electrode;
   forming odd and even data lines, a second data link line and a second data pad electrode at an end of the second data link line on the gate insulating layer, wherein one of the first and second data link lines is electrically connected to the odd data line, and the other of the first and second data link lines is electrically connected to the even data line;
   forming a thin film transistor connected to the gate line and one of the odd and even data lines;
   forming a passivation layer on the odd and even data lines, the second data link line, the second data pad electrode; and
   forming a pixel electrode on the passivation layer and connected to the thin film transistor.

2. The method according to claim 1, wherein the first and second data link lines cross each other.

3. The method according to claim 1, further comprising forming first and second bridge patterns at the same process of forming the pixel electrode, wherein the first bridge pattern connects the one of the first and second data link lines and the odd data line, and the second bridge pattern connects the other of the first and second data link lines and the even data line.

4. The method according to claim 3, further comprising forming first, third and fourth contact holes in the passivation layer and exposing the odd data line, the even data line and the second data link line, respectively, and forming a second contact hole in the passivation layer and the gate insulating layer and exposing the first data link line.

* * * * *